United States Patent [19]

Takeuchi

[11] Patent Number: 4,862,416
[45] Date of Patent: Aug. 29, 1989

[54] SEMICONDUCTOR MEMORY DEVICE WITH REDUNDANT MEMORY CELL

[75] Inventor: Atsushi Takeuchi, Kawasaki, Japan

[73] Assignee: Fujitsu Limited, Kanagawa, Japan

[21] Appl. No.: 14,331

[22] Filed: Feb. 13, 1987

[30] Foreign Application Priority Data

Feb. 27, 1986 [JP] Japan ................................. 61-42586

[51] Int. Cl.$^4$ ............................................. G11C 7/00
[52] U.S. Cl. ..................................... 371/10; 365/200; 365/230.01
[58] Field of Search ................... 365/200, 201, 230; 371/10, 11, 21

[56] References Cited

U.S. PATENT DOCUMENTS 4,428,068  1/1984  Baba .................................. 365/200
4,463,450  7/1984  Haeusele ........................... 365/200

FOREIGN PATENT DOCUMENTS 59-217300  12/1984  Japan .
60-151899   8/1985  Japan .

Primary Examiner—Joseph A. Popek

[57] ABSTRACT

A semiconductor memory device has a redundant memory cell, wherein faulty memory cells are replaced with redundant memory cells during the production. The memory device comprises a forced release circuit for releasing the replacement with the redundant memory cells, for example, by applying a voltage different from the normal voltage to one terminal of the device. Thus, the faulty state, and the cause of the fault, of the device can be determined.

7 Claims, 4 Drawing Sheets

SEMICONDUCTOR MEMORY DEVICE WITH REDUNDANT MEMORY CELL

BACKGROUND OF THE INVENTION

(1.) Field of the Invention

The present invention relates to a semiconductor memory device with a redundant function, and more particularly, to a semiconductor memory device provided with a redundant memory cell (cell array) wherein the redundant function can be released from the outside if necessary.

(2) Description of the Related Art

The larger the scale of a semiconductor memory device, the higher the probability of the generation of a faulty memory cell, and thus redundant (spare) memory cells are provided. If a faulty memory cell is found during a test, the faulty memory cell is replaced with the redundant memory cell, and increases the production rate.

The replacement of the faulty memory cell with the redundant memory cell is usually performed at a memory device production step. Namely, in the final step of testing the wafer, a faulty memory cell in each chip is detected by a tester, and when a faulty memory cell or cells is detected, the possibility of the replacement thereof is examined (for example, the number of the faulty word lines is not larger than the number of redundant (spare) word lines available). If replacement is possible, the faulty memory cells are replaced with redundant memory cells and the process advances to detect a faulty memory cell in the next chip.

After the faulty memory cells are replaced with the redundant memory cells, the faulty memory cells are not distinguished from the outside, since the replaced memory cell is no different from the normal memory cell (cell array). Namely, when using the memory device, it is impossible to determine by an external examination whether or not the memory cells have been replaced by redundant memory cells. This is most inconvenient when attempting to discover the cause of a fault, as it is important to know whether or not a redundant memory cell is being used, and if a redundant memory cell is being used, to know the location (or address) of the faulty memory cell. Therefore, although the extraction of the output of the ROM (read only memory) for storing the redundant (faulty) memory cell address or the like has been attempted, nevertheless it cannot be determined whether any one of word lines or bit lines in a block is faulty when a sequential plurality of lines has been replaced as a block. In addition, even if the faulty word line or bit line address is determined by reading the outputs of the redundant address ROM, it cannot be determined whether a memory cell on the word line or bit line is faulty.

In addition, the faulty state, e.g., malfunction by voltage fluctuation, malfunction caused by read/write speed, increase of faulty area, cannot be determined.

The art regarding a semiconductor memory device with a redundant memory cell wherein the address of the replaced faulty memory cells can be known, is disclosed in Japanese Unexamined Patent Publications (Kokai) No. 59-217300 (filed Dec. 7, 1984) and No. 60-151899 (filed August 9, 1985).

SUMMARY OF THE INVENTION

An object of the present invention is to provide a semiconductor memory device having a redundant memory cell wherein, even after replacement of the faulty memory cell with the redundant memory cell, the address of the faulty memory cell, the cause of the faulty memory cell, and changes with the lapse of time in the faulty memory cells, can be determined, and thus, an improvement can be made to the production processes.

According to the present invention there is provided a semiconductor memory device receiving an accessing address comprising a plurality of memory cells; a decoder, connected to the memory cells, for selecting the memory cell corresponding to the accessing address; a redundant memory cell for replacing a faulty memory cell in the memory cell; a redundant decoder, connected to the redundant memory cell, for selecting the redundant memory cell; a first nonvalatile memory for storing an address of the faulty memory cell; a second nonvolatile memory for storing an information indicating the use or nonuse of the redundant memory cell; a comparator means, connected to the first nonvolatile memory, for comparing the accessing address with the address of the faulty memory cell stored in the first nonvolatile memory; and a forced release circuit, connected to the comparator means, for releasing the replacement by the redundant memory cell. The comparator means makes the redundant decoder active and makes the decoder inactive when the accessing address coincides with the address of the faulty memory cell. The forced release circuit makes the decoder active and makes redundant decoder inactive by applying a forced redundant release signal, even when the accessing address coincides with the address of the faulty memory cell.

In the memory device having a redundant function, if the release of the replacement of the redundant memory cell is carried out, the states of the faulty memory cells can be easily determined, as follows. Namely, if the memory is read out in the condition where the redundant function is released and an abnormality is not found in the read out data, the memory cell at that address is normal and a redundant memory cell has not been used. If a bit error is found in the read out data, the memory cell at that the address is faulty and the cells connected to the word line or the bit line at that the address should be replaced with the redundant memory cell.

DESCRIPTION OF THE PREFERRED EMBODIMENTS

Figure 1:
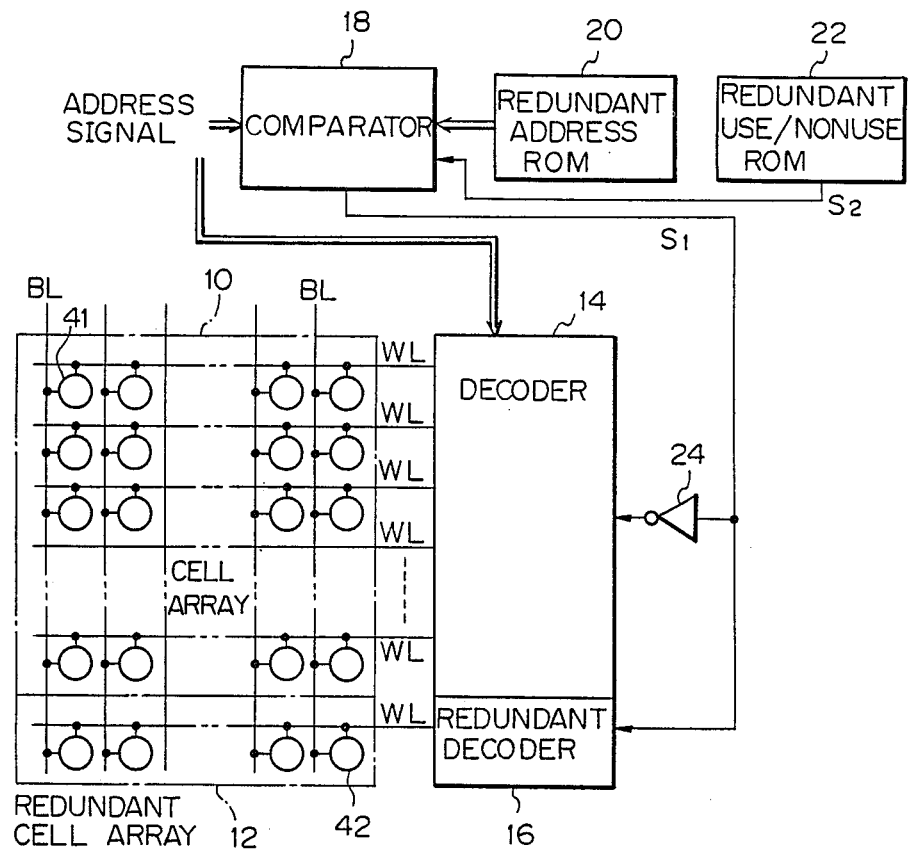
FIG. 1 is a block circuit diagram of a conventional semiconductor memory device with a redundant cell array.

Prior to the explanation of embodiments of the present invention, a conventional semiconductor memory device with a redundant cell array is explained with reference to FIG. 1.

The conventional device comprises a normal memory cell array 10 in which memory cells 41 are arranged, a redundant (spare) cell array 12 in which memory cells 42 are arranged, appended to the normal memory cell array 10, a decoder 14 for the cell array 10, a redundant decoder 16 for the redundant cell array 12, a comparator 18, a redundant address ROM 20 (first nonvolatile memory) for storing a redundant (faulty) address, and a redundant use/nonuse ROM 22 (second nonvolatile memory) for storing the redundant use or nonuse. The replacement of the faulty memory cell with the redundant memory cell is performed by a word line (WL) or a bit line (BL) as a unit, or a plurality of word lines or bit lines (word line block or bit line block). In this example, the replacement block is a word line block, and therefore, the decoders 14 and 16 are word decoders. In general, the redundant cell array comprises a plurality of word lines and memory cells provided at each cross point of the plurality of word lines and bit lines. In FIG. 1, only one word line is shown, for simplicity. Addresses of the word lines including the faulty memory cells are written into the ROM 20. An address signal applied to the decoder 14 and the comparator 18 is the word line address which is a portion of the address signal of a plurality of bits for a memory access. The ROM 22 outputs, for example, an H (high) level, if the redundant memory cell is used, and an L (low) level if the redundant memory cell is not used.

The comparator 18 generates the output signal $S_1$ which is, for example, L level, when the address accessing the memory does not coincide with the address stored in the ROM 20. The signal $S_1$, being L level, is applied to the redundant decoder 16 and makes the redundant decoder 16 inactive, further the signal $S_1$ is inverted through an inverter 24, and the inverted signal is applied to and makes the decoder 14 active. Then, the decoder 14 selects the word line of the cell array 10 corresponding to the applied address signal, and thus the memory device operates as usual. On the contrary, the comparator 18 makes the output signal $S_1$ H level, if the address signal coincides with the stored address of the ROM 20 and if an H level signal showing the redundant use is applied to the comparator 18 from the ROM 22. As a result, the decoder 14 is made inactive, and the redundant decoder 16 is made active, and the selection of the word line of the redundant cell array is carried out in response to the applied address signal.

If there is only one word line of the redundant cell array, the redundant decoder 16 is not always necessary. The word line selection is carried out to apply the H level signal $S_1$ directly or through a word driver. Of course, in this case, only the faulty memory cells belonging to the one word line can be replaced, and the address stored in the ROM 20 is a word address of the faulty memory cell. Where N number of word lines are replaced with the redundant cell array, the faulty memory cells corresponding to the N number of word lines can be replaced. In this case, the maximum number of faulty addresses stored in the ROM 20 are N word addresses. Where the redundant cell array provides N number of word lines and all of the lines are used, the operation is the same as described above. In this case, the coincidence of the addresses occurs N times and the switching by the comparator 18 is carried out at each coincidence.

When the replacement of N number of word lines with the redundant cell array is carried out, the output $S_1$ of the comparator 18 becomes N lines in FIG. 1. The number of inverters 24 is increased accordingly.

Assuming that the faulty memory cells in the normal cell array replaced by the redundant memory cells are on a sequential plurality of word lines, the number of address bits stored in the ROM 20 can be decreased. For example, assuming that N is 4 and one block consisting of four sequential lines is replaced with that of the cell array 10, 2 bits of the lower figure can be omitted and the comparator 18 need compare only the upper remaining bits.

Figure 2:
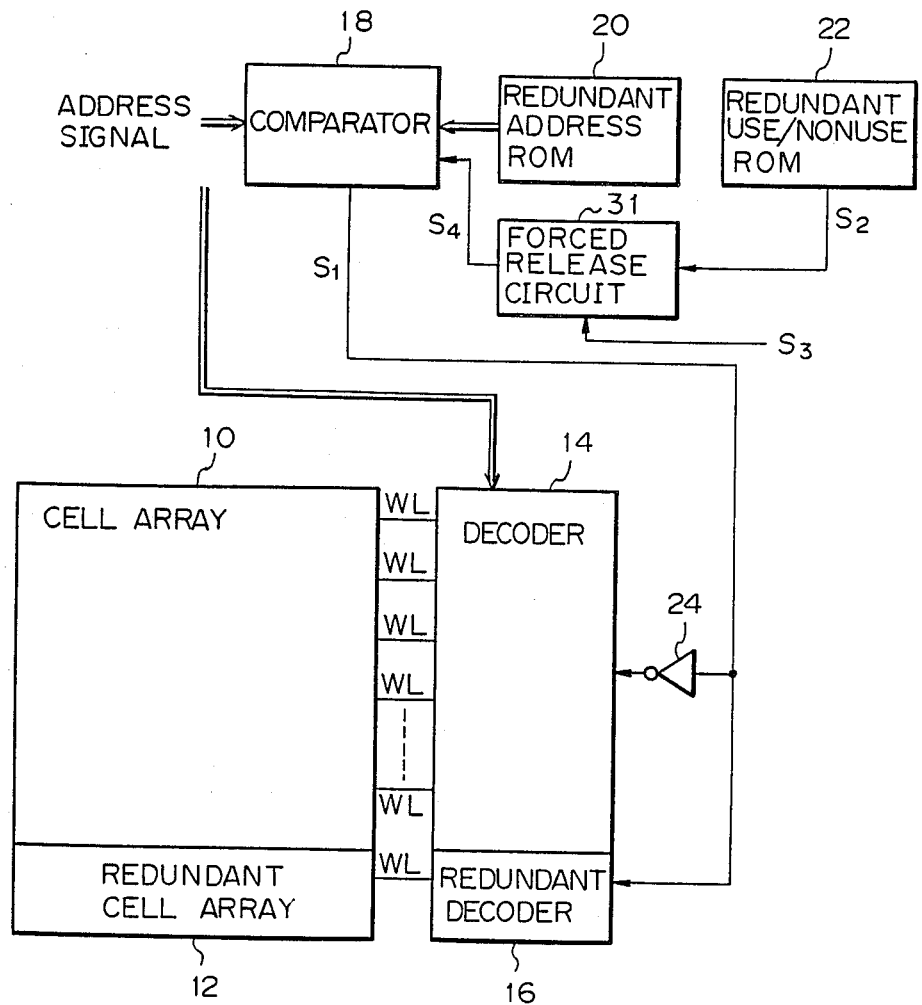
FIG. 2 is a block circuit diagram of a semiconductor memory device with a redundant cell array according to a first embodiment of the present invention.

A first embodiment of this invention is explained with reference to FIG. 2. In this device a forced release circuit 31 for a redundant function is added between the redundant use/nonuse ROM 22 (second nonvolatile memory) and the comparator 18. Also, a forced redundant release signal $S_3$ is applied to the circuit 31. The remaining constitution and operations are the same as for the device shown in FIG. 1.

Figure 4:
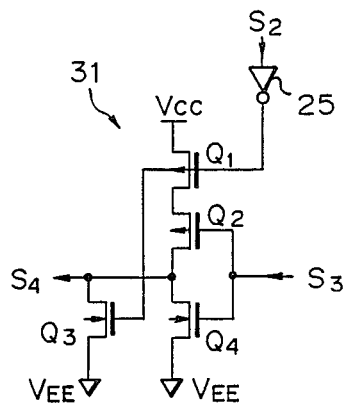
FIG. 4 is a circuit diagram of a forced release circuit for a redundant cell array in the device shown in FIG. 2.

To release the redundant function, the output signal $S_1$ of the comparator 18 in FIG. 1 must be always at L level. The forced release circuit 31 to release the redundant function is shown in FIG. 4. The output $S_2$ of the redundant use/nonuse ROM 22 is at H level in the redundant use and at L level in the redundant nonuse in this example, and therefore, an inverted signal of the signal $S_2$ through an inverter 25 is applied to one input of a NOR gate which comprises p channel MOS transistors $Q_1$ and $Q_2$ and n channel MOS transistors $Q_3$ and $Q_4$. The forced redundant release signal $S_3$ is applied to the other input of the NOR gate. The signal $S_3$ is at H level to release the redundant function. The output $S_4$ of the NOR gate is applied to the comparator 18.

In this circuit, the transistors $Q_1$, $Q_2$, and $Q_4$ are connected in series between a $V_{CC}$ terminal as a positive side of the power source and $V_{EE}$ terminal as a negative side of the source, and the inverted signal of the signal $S_2$ is applied to the gate of the transistor $Q_1$ and the signal $S_3$ is applied to the gate of the transistors $Q_2$ and $Q_4$. The transistor $Q_3$ is connected between the $V_{EE}$ terminal and the output ($S_4$) terminal and, further, the inverted signal of the signal $S_2$ is applied to the gate of the transistor $Q_3$.

By using this circuit, when the redundant function is not released as usual, the signal $S_3$ is at L level, and when the device is in the redundant use state, the signal $S_2$ is at H level. Therefore, in this state, the signal $S_4$ is at H level. If the device is in the redundant nonuse state, the signal $S_2$ is at L level, an thus the signal $S_4$ is at L level. On the other hand, when the redundant function is released, the signal $S_3$ is at H level, and the signal $S_4$ is at L level. Since the redundant memory cells are not used, if a word line address having a faulty memory cell is accessed, the faulty word line in the cell array 10 is selected, and the data stored in the memory cell on the word line is read out. This data has an error at the portion of the faulty memory cell. The error is found by comparison with the correct data. The address of the faulty memory cell can be determined by the error bit of the data.

Figure 3:
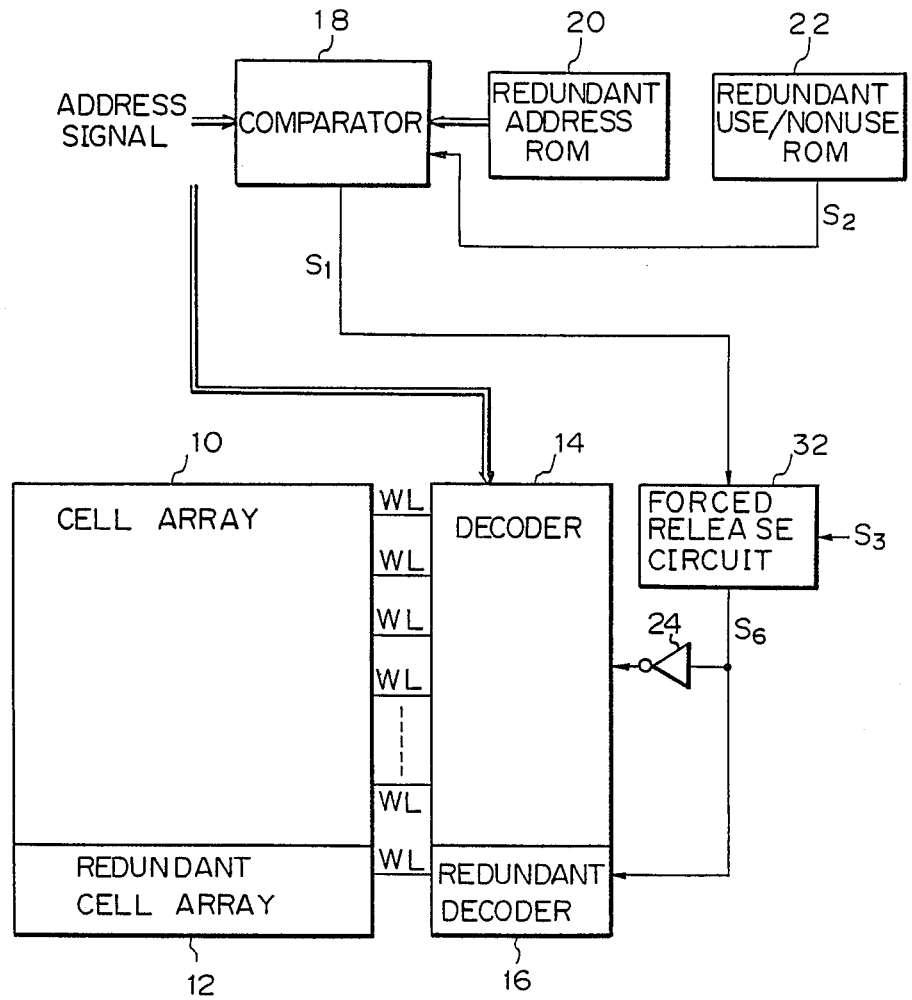
FIG. 3 is a block circuit diagram of a semiconductor memory device with a redundant cell array according to a second embodiment of the present invention.

FIG. 3 shows a semiconductor memory device with a redundant cell array according to a second embodiment of this invention. In this device, the output $S_1$ of the comparator 18 is supplied to a forced release circuit 32, and the output $S_6$ of the forced release circuit 32 is supplied to the decoder 14 through the inverter 24 and to the redundant decoder 16. The forced redundant release signal $S_3$ is applied to the circuit 32. The remaining constitution and operations are the same as for the device shown in FIG. 1.

Figure 5:
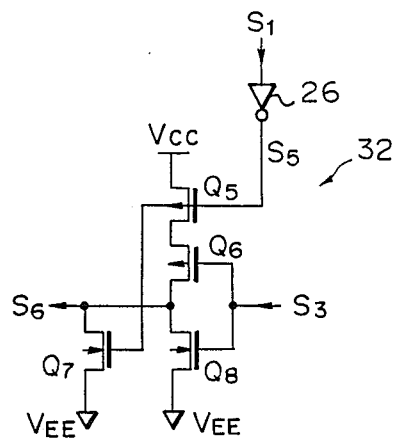
FIG. 5 is a circuit diagram showing a forced release circuit for a redundant cell array in the device shown in FIG. 3.

The circuit diagram of the circuit 32 is shown in FIG. 5. The output signal $S_1$ of the comparator 18 is inverted through an inverter 26 and the inverted signal $S_5$ is applied to one input of an NOR gate which comprises p channel MOS transistors $Q_5$ and $Q_6$ and n channel MOS transistors $Q_7$ and $Q_8$. The forced redundant release signal $S_3$ is applied to the other input of the NOR gate. Namely, the transistors $Q_5$, $Q_6$, and $Q_8$ are connected in series between the $V_{CC}$ terminal and $V_{EE}$ terminal. The signal $S_5$ is applied to the gate of the transistor $Q_5$ and the signal $S_3$ is applied to the gate of the transistors $Q_6$ and $Q_8$. The transistor $Q_7$ is connected between the $V_{EE}$ terminal and the output $(S_6)$ terminal, and the signal $S_5$ is applied to the gate of the transistor $Q_7$.

In this circuit, the signal $S_3$ is at L level in an ordinary state in which the faulty memory cells are replaced with the redundant cells. In addition, when the address for memory accessing coincides with the address stored in the ROM 20 (first nonvolatile memory), the signal $S_1$ is at H level, and thus the signal $S_5$ is at L level and the signal $S_6$ becomes H level. The signal $S_6$ is applied to and makes active the redundant decoder 16, and is further applied to and makes the decoder 14 inactive, through the inverter 24. When the address for memory access does not coincide with the address stored in the ROM 20, the signal $S_1$ is at L level, thus the signal $S_5$ is at H level and the signal $S_6$ is at L level, the decoder 14 is active, and the redundant decoder 16 is inactive. When the faulty cells are not replaced with the redundant memory cells, the signal $S_3$ is at H level, thus the signal $S_6$ is always at L level, the decoder 14 is active, and the redundant decoder 16 is inactive.

Figure 6:
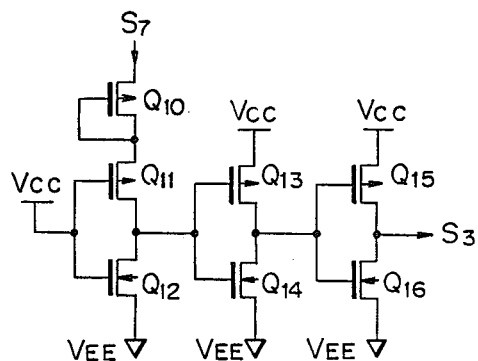
FIG. 6 is a circuit diagram of a circuit for obtaining a forced redundant release signal in the devices shown in FIGS. 4 and 5.

FIG. 6 shows an example of a circuit generating the forced redundant release signal $S_3$. Transistors $Q_{11}$ and $Q_{12}$, $Q_{13}$ and $Q_{14}$, and $Q_{15}$ and $Q_{16}$ are CMOS inverters, and are connected in cascade. A first stage of the CMOS inverters is connected to the input signal $S_7$ through a p channel MOS transistor $Q_{10}$, the gate and drain of which are interconnected. In this circuit, at an ordinary time, when the voltage of the signal $S_7$ is less than that of $V_{CC}$, the output of the first stage inverter is at L level, the output of the second stage inverter is at H level, and the output of the third stage inverter $S_3$ is at L level. When the replacement of the faulty memory cells is released, the voltage of the signal $S_7$ is made to be sufficiently higher than that of $V_{CC}$. Making an attempt as above-mentioned, the output level of the first stage inverter increases, the second stage inverter outputs an L level and receives an H level at the input thereof. Therefore, the output $S_3$ of the third stage inverter becomes at H level, and thus the forced redundant release signal $S_3$ is obtained.

The input signal $S_7$ is applied to an appropriate terminal pin of a package of the device. In this case, it is preferable to use the terminal pins other than those for address signals, as the memory access will be thereby obstructed.

As explained above, according to this invention, the replacement of faulty memory cells with redundant memory cells can be released, for example, by an application of a high voltage to one of the terminal pins of the device, and the address of the faulty storing cell can be determined by reading out stored data in this state, and therefore, it is highly advantageous in clarifying the cause of the faulty memory cell or the like. Namely, a detailed aspect of the memory cells on the associated word line is obtained. For example, the causes of the faulty memory cells, i.e., writing or reading malfunction, fluctuation of the power source voltage, malfunction during high speed operation, or an increase of the faulty portion of the memory array over a period of time, etc., can be determined.

I claim:

1. A semiconductor memory device receiving an accessing address comprising:
    a plurality of memory cells;
    a decoder, connected to said memory cells, for selecting the memory cell corresponding to the accessing address;
    a redundant memory cell for replacing a faulty memory cell in the memory cells;
    a redundant decoder, connected to said redundant memory cell, for selecting the redundant memory cell;
    a first nonvolatile memory for storing an address of the faulty memory cell;
    a second nonvolatile memory for storing information indicating the use or nonuse of the redundant memory cell;
    a comparator means, connected to said first nonvolatile memory, said redundant decoder and said decoder, for comparing the accessing address with the address of the faulty memory cell stored in the first nonvolatile memory and for making the redundant decoder active and making the decoder inactive when the accessing address coincides with the address of the faulty memory cell; and
    a forced release circuit, connected to said comparator means and said second nonvolatile memory, for receiving a forced redundant release signal, for releasing the replacement of the faulty memory cell by the redundant memory cell, for making the decoder active, and for making the redundant decoder inactive by application of the forced redundant release signal to the comparator means, even when the accessing address coincides with the address of the faulty memory cell.

2. A semiconductor memory device as set forth in claim 1, wherein said forced release circuit receives the output of the comparator means and the output of said forced release circuit is applied to the decoder and the redundant decoder.

3. A semiconductor memory device as set forth in claim 2, wherein said forced release circuit is constituted by an inverter and a NOR gate and the output of the comparator means is applied to the input of the inverter, the output of the inverter is applied to one input of the NOR gate, the forced redundant release signal is applied to the other input of the NOR gate, and the output of the NOR gate is applied to the decoder and the redundant decoder.

4. A semiconductor memory device receiving an accessing address comprising:
    a plurality of memory cells;
    a decoder, connected to said memory cells, for selecting the memory cell corresponding to the accessing address;

a redundant memory cell for replacing a faulty memory cell in the memory cells;

a redundant decoder, connected to said redundant memory cell, for selecting the redundant memory cell;

a first nonvolatile memory storing an address of the faulty memory cell;

a second nonvolatile memory storing information indicating the use or nonuse of the redundant memory cell;

a comparator means, connected to said first nonvolatile memory and connected to said second nonvolatile memory, for comparing the accessing address with the address of the faulty memory cell stored in the first nonvolatile memory and for making the redundant decoder active and making the decoder inactive when the accessing address coincides with the address of the faulty memory cell; and a forced release circuit, connected to said comparator means, said decoder and said redundant decode, said force release circuit for receiving a forced redundant release signal, for releasing the replacement of the faulty memory cell by the redundant memory cell, for making the decoder active, and for making the redundant decoder inactive by application of the forced redundant release signal, even when the accessing address coincides with the address of the faulty memory cell.

5. A semiconductor memory device as set forth in claim 4, wherein said forced release circuit receives an output of the second nonvolatile memory and an output of said forced release circuit is applied to the comparator means.

6. A semiconductor memory device as set forth in claim 5, wherein said forced release circuit is constituted by an inverter and a NOR gate and the output of the second nonvolatile memory is applied to the input of the inverter, the output of the inverter is applied to one input of the NOR gate, the forced redundant release signal is applied to the other input of the NOR gate, and the output of the NOR gate is applied to the comparator means.

7. A semiconductor memory device as set forth in claim 1, 6, or 3, wherein said forced redundant release signal is obtained by applying a voltage different from a normal voltage to one terminal of a forced redundant release signal generating circuit of said semiconductor memory device.

* * * * *